(12) United States Patent
Yamamoto

(10) Patent No.: US 9,698,334 B2
(45) Date of Patent: Jul. 4, 2017

(54) MULTI-LAYER PIEZOELECTRIC ELEMENT, AND INJECTION DEVICE AND FUEL INJECTION SYSTEM PROVIDED WITH THE SAME

(71) Applicant: KYOCERA Corporation, Kyoto-shi, Kyoto (JP)

(72) Inventor: Ken Yamamoto, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 316 days.

(21) Appl. No.: 14/387,875

(22) PCT Filed: Jul. 30, 2013

(86) PCT No.: PCT/JP2013/070617
§ 371 (c)(1),
(2) Date: Sep. 25, 2014

(87) PCT Pub. No.: WO2014/021324
PCT Pub. Date: Feb. 6, 2014

(65) Prior Publication Data
US 2015/0034050 A1   Feb. 5, 2015

(30) Foreign Application Priority Data

Jul. 30, 2012   (JP) .................................. 2012-168576

(51) Int. Cl.
*H01L 41/083* (2006.01)
*H01L 41/293* (2013.01)
(Continued)

(52) U.S. Cl.
CPC ....... *H01L 41/0838* (2013.01); *F02M 55/025* (2013.01); *H01L 41/0472* (2013.01);
(Continued)

(58) Field of Classification Search
CPC ............. H01L 41/0838; H01L 41/0831; H01L 41/0833; H01L 41/0835; H01L 41/0836
(Continued)

(56) References Cited

U.S. PATENT DOCUMENTS 6,563,687 B2 * 5/2003 Kawazoe ............. F02M 47/027
361/301.4
6,845,920 B2 * 1/2005 Sato ...................... F02M 47/027
239/102.1
(Continued)

FOREIGN PATENT DOCUMENTS

DE   102010001249 A1   7/2011
JP   2002-202024 A     7/2002
(Continued)

OTHER PUBLICATIONS

International Search Report, PCT/JP2013/070617, Oct. 3, 2013, 2 pgs.
(Continued)

*Primary Examiner* — Sizo Vilakazi
*Assistant Examiner* — Brian Kirby
(74) *Attorney, Agent, or Firm* — Volpe and Koenig, P.C.

(57) ABSTRACT

A multi-layer piezoelectric element includes: a stacked body comprising an active section, and inactive sections disposed at opposite ends in a stacking direction of the active section; an electrically-conductive bonding material disposed on a side surface of the stacked body from the active section to the inactive sections; and an external electrode plate attached, through the electrically-conductive bonding material, to the side surface of the stacked body, a spacing between a side surface of at least one of the inactive sections and the external electrode plate being wider than a spacing between a side surface of the active section and the external electrode plate, and the electrically-conductive bonding
(Continued)

material situated between the side surface of at least one of the inactive sections and the external electrode plate being larger in thickness than the electrically-conductive bonding material situated between the side surface of the active section and the external electrode plate.

7 Claims, 4 Drawing Sheets

(51) Int. Cl.
H01L 41/047 (2006.01)
F02M 55/02 (2006.01)
F02M 51/06 (2006.01)

(52) U.S. Cl.
CPC ........ H01L 41/083 (2013.01); H01L 41/0833 (2013.01); H01L 41/293 (2013.01); F02M 51/0603 (2013.01)

(58) Field of Classification Search
USPC .................... 123/456; 310/323.06, 340, 367
See application file for complete search history.

(56) References Cited

U.S. PATENT DOCUMENTS

| 7,282,839 | B2* | 10/2007 | Mochizuki | H01L 41/0475 310/366 |
| 7,492,075 | B2* | 2/2009 | Tsuzuki | H01L 41/053 310/328 |
| 7,633,210 | B2* | 12/2009 | Ono | H01L 41/083 310/328 |
| 7,665,445 | B2* | 2/2010 | Venkataraghavan | F02M 47/027 123/498 |
| 2001/0047796 | A1 | 12/2001 | Yamada et al. | |
| 2004/0178701 | A1* | 9/2004 | Sato | H01L 41/0838 310/328 |
| 2005/0255754 | A1* | 11/2005 | Kolkman | H01L 41/0475 439/701 |
| 2006/0042060 | A1* | 3/2006 | Goat | H01L 41/257 29/25.35 |
| 2006/0091766 | A1* | 5/2006 | Mochizuki | H01L 41/0475 310/366 |
| 2006/0119219 | A1* | 6/2006 | Kadotani | H01L 41/273 310/328 |
| 2006/0214541 | A1* | 9/2006 | Tsuzuki | H01L 41/053 310/328 |
| 2007/0062025 | A1* | 3/2007 | Goat | H01L 41/257 29/594 |
| 2007/0164638 | A1* | 7/2007 | Kadotani | H01L 41/293 310/363 |
| 2009/0295256 | A1* | 12/2009 | Okamura | H01L 41/0471 310/363 |
| 2010/0032503 | A1* | 2/2010 | Terazono | H01L 41/0838 239/569 |
| 2010/0320283 | A1* | 12/2010 | Sata | H01L 41/337 239/102.2 |

FOREIGN PATENT DOCUMENTS

| JP | 2005-223014 A | 8/2005 |
| JP | 2006-128402 A | 5/2006 |
| JP | 2011-176114 A | 9/2011 |

OTHER PUBLICATIONS

Extended European Search Report, European Patent Application No. 13825396.8, Feb. 24, 2016, 6 pgs.
Chinese Office Action with English concise explanation, Chinese Patent Application No. 201380011070.0, Mar. 4, 2016, 8 pgs.

* cited by examiner

MULTI-LAYER PIEZOELECTRIC ELEMENT, AND INJECTION DEVICE AND FUEL INJECTION SYSTEM PROVIDED WITH THE SAME

TECHNICAL FIELD

The present invention relates to a multi-layer piezoelectric element used for, for example, a piezoelectric driving element (piezoelectric actuator), a pressure sensor element, a piezoelectric circuit element, and so forth, as well as to an injection device and a fuel injection system provided with the multi-layer piezoelectric element.

BACKGROUND ART

As a multi-layer piezoelectric element, as shown in FIG. 7, there is known a construction comprising: a stacked body 6 including an active section 4 composed of a of piezoelectric layers 2 and internal electrode layers 3, and an inactive section 5 disposed at each end in a stacking direction of the active section 4; an electrically-conductive bonding material 7 disposed on a side surface of the stacked body 6 so as to extend from the active section 4 to the inactive section 5; and a flat external electrode plate 80 attached, through the electrically-conductive bonding material 7, to the side surface of the stacked body 6 (refer to Patent Literature 1).

CITATION LIST

Patent Literature

Patent Literature 1: Japanese Unexamined Patent Publication JP-A 2005-223014

SUMMARY OF INVENTION

Technical Problem

In the multi-layer piezoelectric element as described in Patent Literature 1, heat is accumulated due to a self-heating phenomenon which occurs in the stacked body 6 during driving operation, and, since the active section 4 including the internal electrode layer 3 is greater in thermal expansion than the inactive section 5 free from the internal electrode layer 3, it follows that the electrically-conductive bonding material 7 located near the boundary between the active section 4 and the inactive section 5 may become cracked or come unstuck, which results in the possibility of separation of the external electrode plate 80.

The invention has been devised in view of the problem as mentioned above, and accordingly an object of the invention is to provide a multi-layer piezoelectric element capable of suppressing separation of an external electrode plate, as well as an injection device and a fuel injection system provided with the same.

Solution to Problem

The invention provides a multi-layer piezoelectric element, comprising: a stacked body comprising an active section composed of a stack of piezoelectric layers and internal electrode layers, and inactive sections disposed at opposite ends in a stacking direction of the active section; an electrically-conductive bonding material disposed on a side surface of the stacked body, the electrically-conductive bonding material extending from the active section to the inactive sections; and an external electrode plate attached, through the electrically-conductive bonding material, to the side surface of the stacked body, a spacing between a side surface of at least one of the inactive sections disposed at the opposite ends of the active section and the external electrode plate being wider than a spacing between a side surface of the active section and the external electrode plate, and the electrically-conductive bonding material situated between the side surface of at least one of the inactive sections disposed at the opposite ends and the external electrode plate being larger in thickness than the electrically-conductive bonding material situated between the side surface of the active section and the external electrode plate.

Moreover, the invention provides an injection device, comprising: a container provided with an injection hole; and the above-described multi-layer piezoelectric element, a fluid stored in the container being injected through the injection hole by driving the multi-layer piezoelectric element.

Furthermore, the invention provides a fuel injection system, comprising: a common rail configured to store a high-pressure fuel; the above-described injection device configured to inject the high-pressure fuel stored in the common rail; a pressure pump configured to supply the high-pressure fuel to the common rail; and an injection control unit configured to send driving signals to the injection device.

Advantageous Effects of Invention

According to the multi-layer piezoelectric element of the invention, since the spacing between the side surface of at least one of the inactive sections disposed at the opposite ends of the active section and the external electrode plate is wider than the spacing between the side surface of the active section and the external electrode plate, and also, since the thickness of the electrically-conductive bonding material situated between the side surface of at least one of the inactive sections disposed at the opposite ends and the external electrode plate is larger than the thickness of the electrically-conductive bonding material situated between the side surface of the active section and the external electrode plate, it follows that heat resulting from a self-heating phenomenon can be readily dissipated from a region of the external electrode plate corresponding to the active section, and, on the other hand, the heat cannot be dissipated readily from a region of the external electrode plate corresponding to the inactive section. Accordingly, a difference in thermal expansion between the inactive section and the active section is reduced, wherefore a multi-layer piezoelectric element which excels in long-term durability can be attained.

Moreover, according to the injection device of the invention, it is possible to suppress separation of the external electrode plate of the multi-layer piezoelectric element, and thereby perform fluid injection in an intended manner with stability for a long period of time.

According to the fuel injection system of the invention, it is possible to perform injection of high-pressure fuel in an intended manner with stability for a long period of time.

DESCRIPTION OF EMBODIMENTS

Hereinafter, a multi-layer piezoelectric element according to an embodiment of the invention will be described in detail with reference to the drawings.

Figure 1:
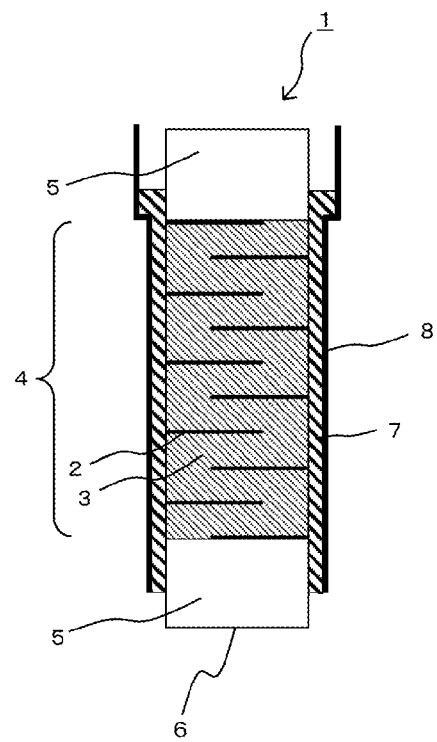
FIG. 1 is a longitudinal sectional view showing a multi-layer piezoelectric element according to an embodiment of the invention.

FIG. 1 is a sectional view showing a multi-layer piezoelectric element according to an embodiment of the invention. The multi-layer piezoelectric element 1 as shown in FIG. 1 includes: a stacked body 6 comprising an active section 4 composed of a stack of piezoelectric layers 2 and internal electrode layers 3, and inactive section 5s disposed at opposite ends in a stacking direction of the active section 4; an electrically-conductive bonding material 7 disposed on a side surface of the stacked body 6, the electrically-conductive bonding material extending from the active section 4 to the inactive sections 5; and an external electrode plate 8 attached, through the electrically-conductive bonding material 7, to the side surface of the stacked body 6, wherein a spacing between a side surface of at least one of the inactive sections 5 disposed at the opposite ends and the external electrode plate 8 is wider than a spacing between a side surface of the active section 4 and the external electrode plate 8, and the electrically-conductive bonding material 7 situated between the side surface of at least one of the inactive sections 5 disposed at the opposite ends and the external electrode plate 8 is larger in thickness than the electrically-conductive bonding material 7 situated between the side surface of the active section 4 and the external electrode plate 8.

The stacked body 6 constituting the multi-layer piezoelectric element 1, which is constructed by stacking the piezoelectric layers 2 and the internal electrode layers 3 on top of each other, includes the active section 4 composed of a stack of a plurality of the piezoelectric layers 2 and the internal electrode layers 3, and the inactive sections 5 composed of the piezoelectric layer 2 disposed at the opposite ends in the stacking direction of the active section 4. The stacked body 6 has the form of a rectangular prism which is 0.5 to 10 mm long, 0.5 to 10 mm wide, and 1 to 100 mm high, for example.

The piezoelectric layer 2 constituting the stacked body 6 is made of ceramics having piezoelectric property, and, as such a ceramics, for example, a perovskite-type oxide made of lead zirconate titanate ($PbZrO_3$—$PbTiO_3$), lithium niobate ($LiNbO_3$), and lithium tantalate ($LiTaO_3$) can be used. The piezoelectric layer 2 has a thickness in a range of 3 to 250 µm, for example.

The internal electrode layers 3 constituting the stacked body 6 which are made by co-firing with ceramics used to form the piezoelectric layers 2, and the internal electrode layers 3 are alternately stacked together with the piezoelectric layers 2 in a manner such that one piezoelectric layer 2 is vertically sandwiched between the internal electrode layers 3, and in which positive electrodes and negative electrodes are disposed according to a stacking order, so that a driving voltage can be applied to the piezoelectric layer 2 sandwiched between the positive and negative electrodes. As constituent materials, for example, a conductor composed predominantly of a silver-palladium alloy whose reactivity with piezoelectric ceramics is low, or a conductor containing copper, platinum, or the like can be used. In the embodiment as shown in FIG. 1, the positive electrodes and the negative electrodes (or grounding electrodes) are led out to paired opposed side surfaces of the stacked body 6 in a staggered arrangement so as to be electrically connected to paired electrically-conductive bonding materials 7 attached to the side surfaces, respectively, of the stacked body 6. The internal electrode layer 3 has a thickness of 0.1 to 5 µm, for example.

The paired electrically-conductive bonding materials 7 are each disposed on the side surface of the stacked body 6 so as to extend from the active section 4 to the inactive section 5 for electrical connection with the led-out ends of the internal electrode layers 3. The electrically-conductive bonding material 7 pair should preferably be formed of, for example, an electrically-conductive adhesive comprising an epoxy resin or polyimide resin containing highly electrically conductive metal powder such as Ag powder or Cu powder. The electrically-conductive bonding material 7 has a thickness of 5 to 500 µm, for example.

Moreover, the external electrode plate 8 is attached, through the electrically-conductive bonding material 7, to the side surface of the stacked body 6. Specifically, the external electrode plate 8 is attached, through the electrically-conductive bonding material 7, to the side surface of the stacked body 6 so as to be electrically connected to the internal electrode layer 3, with part thereof extended from one of the end faces in the stacking direction of the stacked body 6. The external electrode plate 8 is composed of a flat plate of metal such as copper, iron, stainless steel, phosphor bronze, or the like which is 0.5 to 10 mm in width and 0.01 to 1.0 mm in thickness, for example. Note that the form of the external electrode plate 8 is not limited to a rectangular metal plate, and therefore, in order to obtain the effect of relaxing a stress caused by expansion and contraction of the stacked body 6, for example, a plate formed with slits disposed in its widthwise direction, and a metal plate having a meshed configuration can be adopted.

Moreover, the external electrode plate 8 is so designed that a spacing between a side surface of at least one of the inactive sections 5 disposed at the opposite ends and the external electrode plate 8 is wider than a spacing between a side surface of the active section 4 and the external electrode plate 8. Correspondingly, the electrically-conductive bonding material 7 situated between the side surface of at least one of the inactive sections 5 disposed at the opposite ends and the external electrode plate 8 is larger in thickness than the electrically-conductive bonding material 7 situated between the side surface of the active section 4 and the external electrode plate 8.

For example, in the form as shown in FIG. 1, the external electrode plate 8 is given a bend to increase the spacing between the side surface of one of the inactive sections 5 and the external electrode plate 8, and the electrically-conductive bonding material 7 is filled in between the inactive section 5 and the external electrode plate 8. For example, given that the spacing between the side surface of the inactive section 5 and the external electrode plate 8 falls in the range of 20 to 500 μm, then the spacing between the side surface of the active section 4 and the external electrode plate 8 falls in the range of 5 μm or more and less than 20 μm.

Thus, where the spacing between the side surface of at least one of the inactive sections 5 and the external electrode plate 8 is wider than the spacing between the side surface of the active section 4 and the external electrode plate 8, and where the thickness of the electrically-conductive bonding material 7 disposed on the side surface of at least one of the inactive sections 5 is greater than the thickness of the electrically-conductive bonding material 7 disposed on the side surface of the active section 4, heat resulting from a self-heating phenomenon caused by driving the multi-layer piezoelectric element 1 can be dissipated readily through the active section 4, and then through the region of the external electrode plate 8 corresponding to the active section 4. On the other hand, the inactive section 5 is farther away from the external electrode plate 8 than is the active section 4, and, the electrically-conductive bonding material 7 is interposed between the inactive section 5 and the external electrode plate 8, wherefore heat cannot be dissipated readily. Accordingly, a difference in thermal expansion between the active section 4 and the inactive section 5 is reduced, which makes it possible to suppress separation of the external electrode plate 8 and thereby achieve enhancement in durability.

Figure 2:
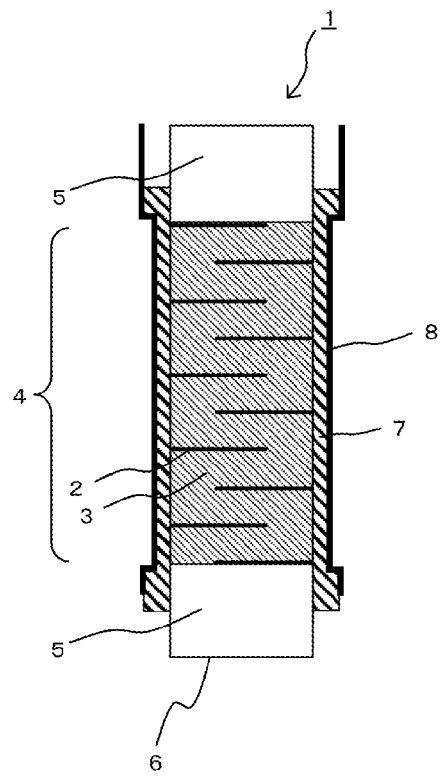
FIG. 2 is a longitudinal sectional view showing a multi-layer piezoelectric element according to another embodiment of the invention.

As shown in FIG. 2, it is preferable that the spacing between the side surface of each of the inactive sections 5 and the external electrode plate 8 is wider than the spacing between the side surface of the active section 4 and the external electrode plate 8. For example, given that the spacing between the side surface of each of the inactive sections 5 and the external electrode plate 8 (the thickness of the electrically-conductive bonding material 7) falls in the range of 20 to 500 μm, then the spacing between the side surface of the active section 4 and the external electrode plate 8 (the thickness of the electrically-conductive bonding material 7) falls in the range of 5 μm or more and less than 20 μm. Since the thickness of the electrically-conductive bonding material 7 disposed on the side surface of each of the inactive sections 5 is greater than the thickness of the electrically-conductive bonding material 7 disposed on the side surface of the active section 5, it follows that the inactive section 5 located at each end in the stacking direction of the stacked body 6 has a decreased rate of heat dissipation, wherefore variations in thermal expansion in the stacking direction of the stacked body 6 can be reduced even further, with consequent further enhancement in durability.

In FIG. 1 and FIG. 2, the external electrode plate 8 is bent at its part corresponding to the boundary between the active section 4 and the inactive section 5 (the part extended from the boundary) to provide a stepped portion as seen in longitudinal section, so that the spacing between the side surface of the inactive section 5 and the external electrode plate 8 is wider than the spacing between the side surface of the active section 4 and the external electrode plate 8.

The bend of the external electrode plate 8 constituting the stepped portion as seen in longitudinal section may be somewhat displaced from the part corresponding to the boundary between the inactive section 5 and the active section 4, and more specifically, it may be displaced toward the active section 4 or the inactive section 5 so long as the amount of displacement is limited to a distance equal to about the thickness of a single piezoelectric layer 3 included in the active section 4.

Figure 3:
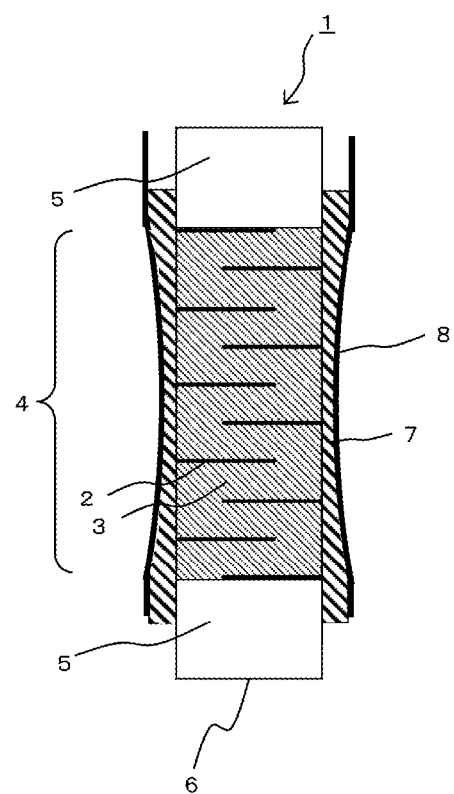
FIG. 3 is a longitudinal sectional view showing a multi-layer piezoelectric element according to another embodiment of the invention.

Moreover, it is desirable to impart a bent or curved portion to the external electrode plate 8 to cause a difference between the active section 4 and the inactive sections 5 in respect of the spacing between the side surface of the stacked body 6 and the external electrode plate 8. Specifically, in a case as shown in FIG. 3, the external electrode plate 8 is curved so that the spacing between the side surface of the stacked body 6 and the external electrode plate 8 in the active section 4 becomes narrowest at the center in the stacking direction of the stacked body 6. That region of the external electrode plate 8 which is located outside of the part corresponding to the boundary between the active section 4 and the inactive section 5 is made flat. By designing the external electrode plate 8 so that its part corresponding to the midportion of the multi-layer piezoelectric element 1 subjected to expansion and contraction is bent or curved, it is possible to reduce stress concentration which occurs at the midportion of the external electrode plate 8 when the multi-layer piezoelectric element 1 expands, and thereby achieve further enhancement in durability.

Figure 4:
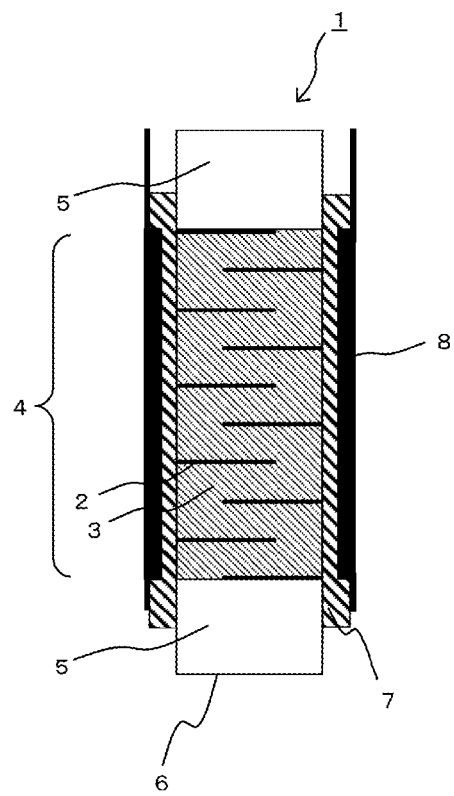
FIG. 4 is a longitudinal sectional view showing a multi-layer piezoelectric element according to another embodiment of the invention.

Although the external electrode plate 8 in the forms as shown in FIG. 1 to FIG. 3 is obtained by the working of a plate-like material, for example, by bending a plate-like material having a uniform thickness in its entirety as seen in section, since what counts is the structure in which the spacing between the side surface of the inactive section 5 and the external electrode plate 8 is wider than the spacing between the side surface of the active section 4 and the external electrode plate 8, the external electrode plate 8 is not limited to the above-described forms. For example, as shown in FIG. 4, by designing the external electrode plate 8 so that the region corresponding to the active section 4 of the stacked body 6 differs in thickness from the region corresponding to the inactive section 5 thereof, it is possible to accomplish the structure in which the spacing between the side surface of the inactive section 5 and the external electrode plate 8 is wider than the spacing between the side surface of the active section 4 and the external electrode plate 8.

Next, a method for manufacturing the multi-layer piezoelectric element 1 of the present embodiment will be described.

The first step is to prepare ceramic green sheets for forming the piezoelectric layers 2. Specifically, a ceramic slurry is prepared by mixing calcined powder of piezoelectric ceramics, a binder made of organic high polymer such as acrylic polymer or butyral polymer, and a plasticizer. Then, the ceramic slurry is shaped into ceramic green sheets by a tape molding technique such as the doctor blade method or calender roll method. The piezoelectric ceramics may be of any type so long as it has piezoelectric properties, and therefore, for example, a perovskite-type oxide made of lead zirconate titanate ($PbZrO_3$—$PbTiO_3$) can be used. Moreover, as the plasticizer, dibutyl phthalate (DBP), dioctyl phthalate (DOP), or the like can be used.

Next, an electrically-conductive paste for forming the internal electrode layers 3 is prepared. Specifically, the electrically-conductive paste is prepared by admixing a binder and a plasticizer in metal powder of a silver-palladium alloy. This electrically-conductive paste is applied, in a pattern of the internal-electrode layer 3, on the aforementioned ceramic green sheets by means of screen printing. Then, a plurality of ceramic green sheets with the printed electrically-conductive paste are stacked on top of each other in layers, and, the layered body is subjected to binder removal treatment at a predetermined temperature, is fired at a temperature of 900 to 1200° C., and is ground into a predetermined shape by means of a surface grinder or otherwise, whereupon the active section 4 composed of a stack of alternate piezoelectric layers 2 and internal electrode layers 3 can be produced. The inactive section 5 is produced by stacking together sheets free from the electrically-conductive paste for forming the internal electrode layers 3. The active section 4 and the inactive section 5 combine to produce the stacked body 6.

The way of producing the stacked body 6 is not limited to the method thus far described, and the stacked body 6 can therefore be produced by any given manufacturing method so long as it allows formation of the stacked body 6 composed of a stack of a plurality of piezoelectric layers 2 and internal electrode layers 3.

Next, the external electrode plate 8 is fixedly connected, through the electrically-conductive bonding material 7, to the side surface of the stacked body 6.

An adhesive made of an epoxy resin or polyimide resin containing highly electrically conductive metal powder such as Ag powder or Cu powder is used for the electrically-conductive bonding material 7, and, the electrically-conductive bonding material 7 is configured while being adjusted to have predetermined thickness and width by means of screen printing, dispensing method, or otherwise.

The external electrode plate 8 is composed of a flat plate of metal such as copper, iron, stainless steel, phosphor bronze, or the like which is 0.5 to 10 mm in width and 0.01 to 1.0 mm in thickness, for example. In order to design the external electrode plate 8 to have slits formed in its widthwise direction, as well as to have a meshed configuration, it is advisable to adopt a punching process using a punching die or a laser process, and, on the other hand, in order to impart a curved or bent portion to the external electrode plate 8, it is advisable to use a bending die.

Subsequently, a DC electric field of 0.1 to 3 kV/mm is applied to the external electrode plate 8 to initiate polarization in the piezoelectric layers 2 constituting the stacked body 6, whereupon the multi-layer piezoelectric element 1 can be completed. In this multi-layer piezoelectric element 1, through the connection with an external power source via the external electrode plate 8, a voltage is applied to the piezoelectric layers 2, so that each of the piezoelectric layers 2 can undergo significant displacement under an inverse piezoelectric effect. Thus, for example, the multi-layer piezoelectric element 1 can be operated as an automotive fuel injection valve capable of supplying a jet of fuel into an engine.

Figure 5:
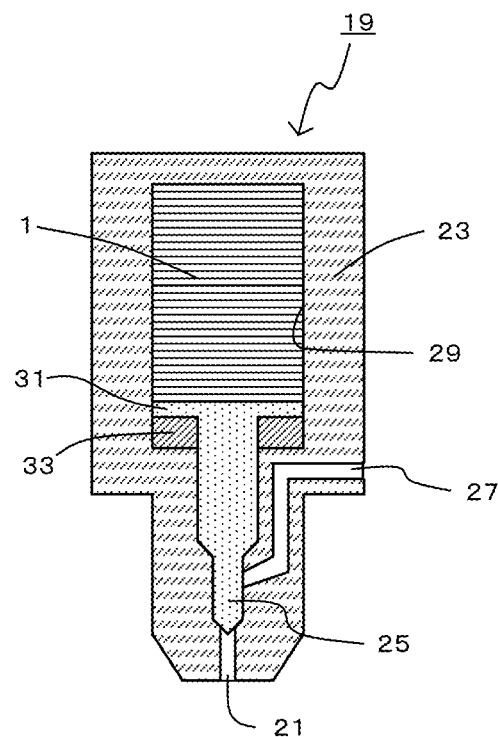
FIG. 5 is a schematic sectional view showing an injection device according to an embodiment of the invention.

Next, an injection device according to an embodiment of the invention will be described. FIG. 5 is a schematic sectional view showing an injection device according to an embodiment of the invention.

As shown in FIG. 5, the injection device 19 of the present embodiment includes a housing (container) 23 provided with an injection hole 21 at one end thereof and the multi-layer piezoelectric element 1 of the foregoing embodiment in the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected to the outside or into an adjacent container, for example, a fuel chamber of an internal combustion engine (not shown).

The needle valve 25 has its upper end made to have a large internal diameter for constituting a piston 31 which is so designed as to be slidable in a cylinder 29 formed in the housing 23. The multi-layer piezoelectric element 1 of the foregoing embodiment is accommodated, in contact with the piston 31, within the housing 23.

In the injection device 19 thus constructed, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Further, upon stopping the application of voltage, the multi-layer piezoelectric element 1 is contracted, and a disc spring 33 pushes the piston 31 backward. In consequence, the fluid passage 27 is opened and the injection hole 21 communicates with the fluid passage 27 so that injection of fluid through the injection hole 21 is carried out.

It is noted that the injection device may be so configured that the fluid passage 27 is opened by applying voltage to the multi-layer piezoelectric element 1, and is closed by stopping the application of voltage.

Moreover, the injection device 19 of the present embodiment may include the housing 23 provided with the injection hole and the multi-layer piezoelectric element 1 of the present embodiment, a fluid filled in the housing 23 being injected through the injection hole 21 by driving the multi-layer piezoelectric element 1. That is, the multi-layer piezoelectric element 1 does not necessarily have to be placed inside the housing 23 so long as the injection device is so designed that a pressure for the control of fluid injection can be applied to the interior of the housing 23 by driving the multi-layer piezoelectric element 1. In the injection device 19 of the present embodiment, the term "fluid" is construed as encompassing not only fuel and ink, but also various matters in liquid form such as an electrically-conductive paste and various matters in gaseous form. The use of the injection device 19 of the embodiment makes it possible to control the flow rate of fluid and the timing of fluid injection with stability for a long period of time.

In the case of using the injection device 19 of the present embodiment employing the multi-layer piezoelectric element 1 of the foregoing embodiment for an internal combustion engine, as compared to the case of using an injection device of conventional design, a fuel can be injected into a combustion chamber of the internal combustion engine such as an engine with higher accuracy for a longer period of time.

Figure 6:
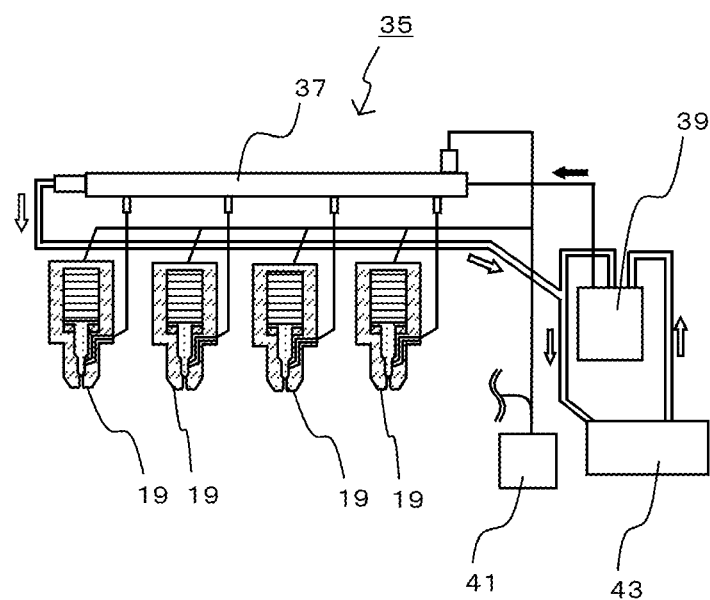
FIG. 6 is a block diagram schematically showing a fuel injection system according to an embodiment of the invention.

Next, a fuel injection system according to an embodiment of the invention will be described. FIG. 6 is a schematic diagram showing a fuel injection system according to an embodiment of the invention.

As shown in FIG. 6, the fuel injection system 35 of the present embodiment includes a common rail 37 configured to store a high-pressure fuel which is a high-pressure fluid; a plurality of injection devices 19 of the foregoing embodiment, each of which is configured to inject the high-pressure fluid stored in the common rail 37; a pressure pump 39 configured to supply the high-pressure fluid to the common rail 37; and an injection control unit 41 configured to send drive signals to the injection devices 19.

The injection control unit 41 controls the amount of injection of the high-pressure fluid and injection timing on the basis of external information or external signals. For example, where the injection control unit 41 is used for fuel injection into an engine, it is possible to control the amount of fuel injection and injection timing while detecting the conditions of the interior of the combustion chamber of the engine by means of a sensor or otherwise. The pressure pump 39 acts to feed a fluid fuel to the common rail 37 from a fuel tank 43 under high pressure. For example, in the fuel injection system 35 for use in engine application, the fluid fuel is fed to the common rail 37 under a pressure of as high as about 1000 to 2000 atmospheres (about 101 MPa to about 203 MPa), and preferably a pressure of as high as about 1500 to 1700 atmospheres (about 152 MPa to about 172 MPa). The common rail 37 stores the high-pressure fuel which has been fed thereto from the pressure pump 39, and feeds it to the injection device 19 on an as needed basis. As has already been described, the injection device 19 injects a certain amount of fluid to the outside or into an adjacent container through the injection hole 21. For example, where a target of fuel supply by injection is an engine, the injection device injects the high-pressure fuel in a mist form into the combustion chamber of the engine through the injection hole 21.

It should be understood that the application of the invention is not limited to the specific embodiments described heretofore, and that various changes and modifications are possible without departing from the scope of the invention. For example, the sectional profile of the stacked body 6 in a direction perpendicular to the stacking direction may be defined by, instead of the rectangular shape as adopted in the foregoing embodiments, a polygonal shape such as a hexagonal shape or an octagonal shape, or a circular shape, or a combination of a straight line and an arc.

For example, the multi-layer piezoelectric element 1 of the embodiment can be used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning device such as an optical device, and an anti-vibration device. Examples of the sensor element include a combustion pressure sensor, a knocking sensor, an acceleration sensor, a load sensor, an ultrasound sensor, a pressure-detecting sensor, and a yaw-rate sensor. Moreover, examples of the circuit element include a piezoelectric gyroscope, a piezoelectric switch, a piezoelectric transformer, and a piezoelectric breaker.

EXAMPLES

Hereinafter, examples of the invention will be described. Multi-layer piezoelectric elements according to the invention were produced in the following manner. To begin with, a ceramic slurry was prepared by mixing calcined powder of piezoelectric ceramics composed predominantly of lead zirconate titanate ($PbZrO_3$—$PbTiO_3$) having an average particle size of 0.4 μm, a binder, and a plasticizer. The ceramic slurry was shaped into 50 μm-thick ceramic green sheets for forming the piezoelectric layers by the doctor blade method.

Next, an electrically-conductive paste for forming the internal electrode layers was prepared by adding a binder to a silver-palladium alloy.

Next, the electrically-conductive paste for forming the internal electrode layers was printed to one side of the ceramic green sheet by means of screen printing, and 200 ceramic green sheets with the printed electrically-conductive paste were stacked on top of each other. Moreover, with this stack of 200 ceramic green sheets having the printed internal electrode layer-forming electrically-conductive paste set as a core, in total, 15 ceramic green sheets having no printed internal electrode layer-forming electrically-conductive paste were stacked on the top and the bottom of the core, respectively. Then, the resultant layered body was fired at a temperature of 980 to 1100° C., and ground into a predetermined shape by means of a surface grinder, whereupon a stacked body of 5 mm square was obtained.

Next, an electrically-conductive bonding material in the form of a paste of a mixture of Ag powder and a polyimide resin was applied to the surface of the stacked body by a dispenser, and, an external electrode plate was fixedly connected to the surface of the stacked body.

As Test sample 1, a multi-layer piezoelectric element was produced with use of a 0.1 mm-thick phosphor bronze-made external electrode plate having a section as shown in FIG. 1. Specifically, the external electrode plate was given a bend to render a spacing between a side surface of one of inactive sections and the external electrode plate wider than a spacing between a side surface of an active section and the external electrode plate. In this construction, an electrically-conductive bonding material made of Ag and polyimide was filled in between the side surface of the active section and the external electrode plate, and, a spacing of 0.1 mm was secured between the side surface of the inactive section and the external electrode plate and a spacing of 0.03 mm was secured between the side surface of the active section and the external electrode plate.

Moreover, as Test sample 2, a multi-layer piezoelectric element was produced with use of a 0.1 mm-thick phosphor bronze-made external electrode plate having a section as shown in FIG. 2. Specifically, the external electrode plate was given a bend to render a spacing between a side surface of each of inactive sections and the external electrode plate wider than a spacing between a side surface of an active section and the external electrode plate. In this construction, an electrically-conductive bonding material made of Ag and polyimide was filled in between the side surface of the active section and the external electrode plate, and, a spacing of 0.1 mm was secured between the side surface of the inactive section and the external electrode plate and a spacing of 0.03 mm was secured between the side surface of the active section and the external electrode plate.

Furthermore, as Test sample 3, a multi-layer piezoelectric element was produced with use of a 0.1 mm-thick phosphor bronze-made external electrode plate having a section as shown in FIG. 3. Specifically, the external electrode plate was given a gentle curve rather than the bend of Test sample 2. In this construction, an electrically-conductive bonding material was filled in between a side surface of an active section and the external electrode plate, and, a minimum of 0.1 mm was secured as a spacing between a side surface of an inactive section and the external electrode plate and a maximum of 0.03 mm was secured as a spacing between the side surface of the active section and the external electrode plate.

Figure 7:
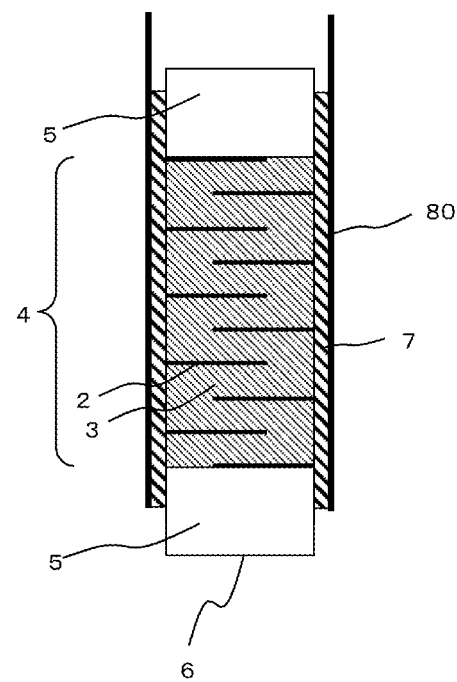
FIG. 7 is a longitudinal sectional view of a conventional multi-layer piezoelectric element.

In addition, as an comparative example (Test sample 4), a multi-layer piezoelectric element was produced with use of an external electrode plate having a section as shown in FIG. 7.

In each of the thusly produced multi-layer piezoelectric elements, a DC electric field of 3 kV/mm was applied to the external electrode plate via a lead member welded to the external electrode plate for 15 minutes to effect polarization. Then, as the result of application of DC voltage of 160 V to the multi-layer piezoelectric elements, a displacement of 30 μm was found in the stacking direction of the stacked body.

Moreover, a durability test was preformed in which each of the multi-layer piezoelectric elements was driven continuously under application of AC voltage ranging from 0 V to +160 V at a frequency of 150 Hz at a temperature of 30° C. and at a humidity of 90%.

The test result showed that, in the multi-layer piezoelectric element of Test sample 4 produced as a comparative example, separation of the external electrode plate occurred in continuous driving operation of $1 \times 10^4$ times, and eventually the driving operation of the multi-layer piezoelectric element came to a stop at $1 \times 10^5$ times.

On the other hand, it has been found that each of the multi-layer piezoelectric elements of Test samples 1, 2, and 3 which were examples of the invention was being driven without suffering from separation of the external electrode plate even after continuous driving operation of $1 \times 10^7$ times.

As will be understood from the test results as described heretofore, according to the invention, a multi-layer piezoelectric element which excels in long-term durability can be implemented.

REFERENCE SIGNS LIST

1: Multi-layer piezoelectric element
2: Piezoelectric layer
3: Internal electrode layer
4: Active section
5: Inactive section
6: Stacked body
7: Electrically-conductive bonding material
8: External electrode plate
19: Injection device
21: Injection hole
23: Housing (Container)
25: Needle valve
27: Fluid passage
29: Cylinder
31: Piston
33: Disc spring
35: Fuel injection system
37: Common rail
39: Pressure pump
41: Injection control unit
43: Fuel tank

The invention claimed is:

1. A multi-layer piezoelectric element, comprising:
a stacked body comprising an active section composed of a stack of piezoelectric layers and internal electrode layers, and inactive sections disposed at opposite ends in a stacking direction of the active section;
an electrically-conductive bonding material disposed on a side surface of the stacked body, the electrically-conductive bonding material extending from the active section to the inactive sections; and
an external electrode plate attached, through the electrically-conductive bonding material, to the side surface of the stacked body,
the external electrode plate being configured so that a spacing between a side surface of the stacked body of at least one of the inactive sections disposed at the opposite ends of the active section and the external electrode plate is wider than a spacing between a side surface of the stacked body of the active section and the external electrode plate,
the external electrode plate being curved so that the spacing between the side surface of the stacked body and the external electrode plate in the active section becomes narrowest at a center in the stacking direction of the stacked body, and
the electrically-conductive bonding material being configured so that the electrically-conductive bonding material situated between the side surface of the stacked body of at least one of the inactive sections disposed at the opposite ends and the external electrode plate is larger in thickness than the electrically-conductive bonding material situated between the side surface of the stacked body of the active section and the external electrode plate.

2. The multi-layer piezoelectric element according to claim 1,
wherein the external electrode plate is configured so that a spacing between a side surface of each of the inactive sections disposed at the opposite ends and the external electrode plate is wider than the spacing between the side surface of the active section and the external electrode plate.

3. An injection device, comprising:
a container provided with an injection hole; and
the multi-layer piezoelectric element according to claim 1,
a fluid stored in the container being injected through the injection hole by driving the multi-layer piezoelectric element.

4. A fuel injection system, comprising:
a common rail configured to store a high-pressure fuel;
the injection device according to claim 3, the injection device being configured to inject the high-pressure fuel stored in the common rail;
a pressure pump configured to supply the high-pressure fuel to the common rail; and
an injection control unit configured to send driving signals to the injection device.

5. The multi-layer piezoelectric element according to claim 1,
wherein the external electrode plate is flat in at least one of the inactive sections disposed at the opposite ends.

6. The multi-layer piezoelectric element according to claim 1,
wherein the electrically-conductive bonding material becomes thinnest at the center in the stacking direction of the stacked body.

7. The multi-layer piezoelectric element according to claim 2,
wherein the external electrode plate is flat in each of the inactive sections disposed at the opposite ends.

* * * * *